(12) United States Patent
Shih

(10) Patent No.: US 10,270,454 B2
(45) Date of Patent: Apr. 23, 2019

(54) METHOD AND SYSTEM FOR CLOCK AND DATA RECOVERY (CDR)

(71) Applicant: TAIWAN SEMICONDUCTOR MANUFACTURING COMPANY LTD., Hsinchu (TW)

(72) Inventor: Yu-Nan Shih, Taichung (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 54 days.

(21) Appl. No.: 15/385,168

(22) Filed: Dec. 20, 2016

(65) Prior Publication Data

US 2018/0152285 A1     May 31, 2018

Related U.S. Application Data

(60) Provisional application No. 62/427,622, filed on Nov. 29, 2016.

(51) Int. Cl.

| *H03L 7/087* | (2006.01) |
|---|---|
| *H04L 7/00* | (2006.01) |
| *H04L 7/033* | (2006.01) |
| *H04L 25/49* | (2006.01) |

(52) U.S. Cl.
CPC ........... *H03L 7/087* (2013.01); *H04L 7/0087* (2013.01); *H04L 7/033* (2013.01); *H04L 25/4917* (2013.01); *H04L 7/0025* (2013.01)

(58) Field of Classification Search
CPC ................................. H04L 7/04; H04L 7/0083
USPC ..................................... 375/355, 287; 326/31
See application file for complete search history.

(56) References Cited

U.S. PATENT DOCUMENTS

| 5,259,005 A | * | 11/1993 | LaRosa | .................. H04L 7/0337 375/355 |
| 2004/0141567 A1 | * | 7/2004 | Yang | ........................ H03L 7/087 375/287 |
| 2005/0134305 A1 | * | 6/2005 | Stojanovic | ............ H04L 25/028 326/31 |

OTHER PUBLICATIONS

J. L. Zerbe, et al., "Equalization and Clock Recovery for a 2.5-10-Gb/s 2-PAM/4-PAM Backplane Transceiver Cell," IEEE J. Solid-State Circuits, vol. 38, No. 12, pp. 2121-2130, Dec. 2003.

(Continued)

*Primary Examiner* — Chieh M Fan
*Assistant Examiner* — Fitwi Y Hailegiorgis
(74) *Attorney, Agent, or Firm* — Juan Carlos A. Marquez; Marquez IP Law Office, PLLC

(57) ABSTRACT

A clock and data recovery (CDR) device is disclosed. The CDR device comprises a sensing unit and an interpolator. The sensing unit is configured to detect a data center, a left data edge and a right data edge of a data on a data stream in a communication system, using a set of thresholds, in response to a first clock signal for sampling the data center, a second clock signal for sampling the left data edge and a third clock signal for sampling the right data edge. Each of the thresholds is related to a different level among data levels of the data. The interpolator is configured to generate the first clock signal based on information on the data center, and generate the second clock signal and the third clock signal based on information on the left and right data edges.

14 Claims, 16 Drawing Sheets

(56) References Cited

OTHER PUBLICATIONS

T. Toifl, et al., "A 22-Gb/s PAM-4 Receiver in 90-nm CMOS SOI Technology," IEEE J. Solid-State Circuits, vol. 41, No. 4, pp. 954-965, Apr. 2006.

* cited by examiner

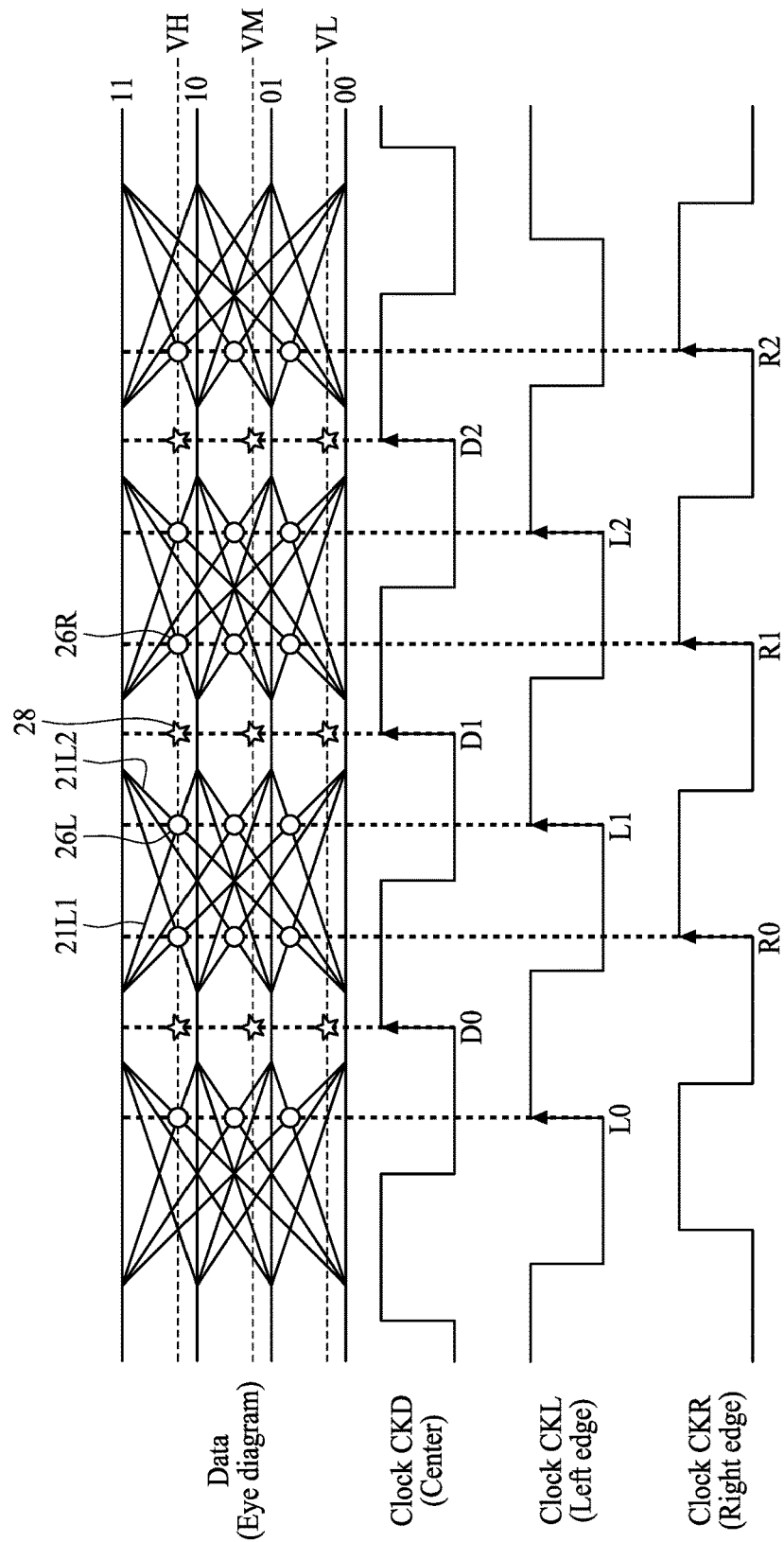

METHOD AND SYSTEM FOR CLOCK AND DATA RECOVERY (CDR)

CROSS REFERENCE TO RELATED APPLICATIONS

This application claims priority to U.S. provisional application Ser. No. 62/427,622, filed 29 Nov. 2016, which is incorporated herein by reference in its entirety.

BACKGROUND

In a high speed communication system, most of serial interfaces do not have any accompanying clock. As a result, in the communication system a receiver needs to recover the clock from a transmitter in order to sample the data on serial lines. To recover the sampling clock, the receiver needs a reference clock of approximately the same frequency. Further, to generate the recovered clock, the receiver needs to phase align the reference clock to the transitions on the incoming data stream. This process is called as clock recovery. Sampling of that incoming data signal with the recovered clock to generate a bit stream is called as data recovery. Together, the entire process is called Clock Data Recovery, or CDR. CDR is required to recover data from incoming data stream in the absence of any accompanying clock signal, without any bit errors due to over/under sampling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a diagram showing a method of clock and data recovery (CDR), in accordance with some embodiments.

DETAILED DESCRIPTION

Figure 1A:
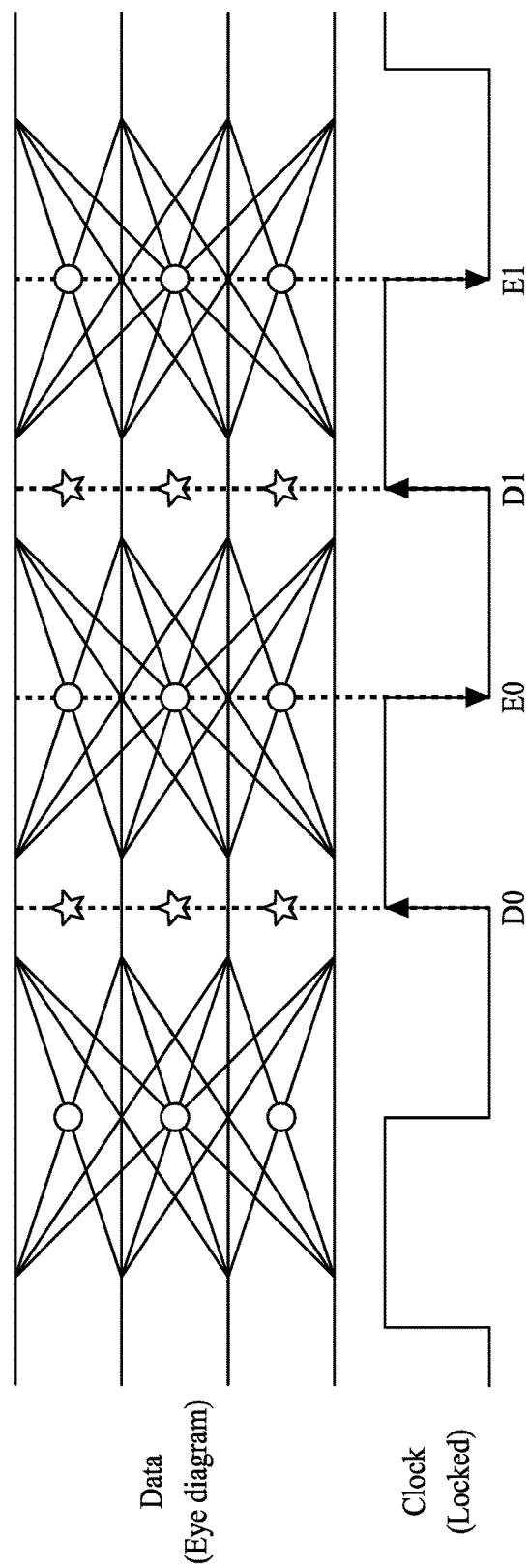
FIGS. 1A, 1B and 1C are schematic diagrams showing phase relationships between data and dock.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpretedaccordingly.

Figure 1B:
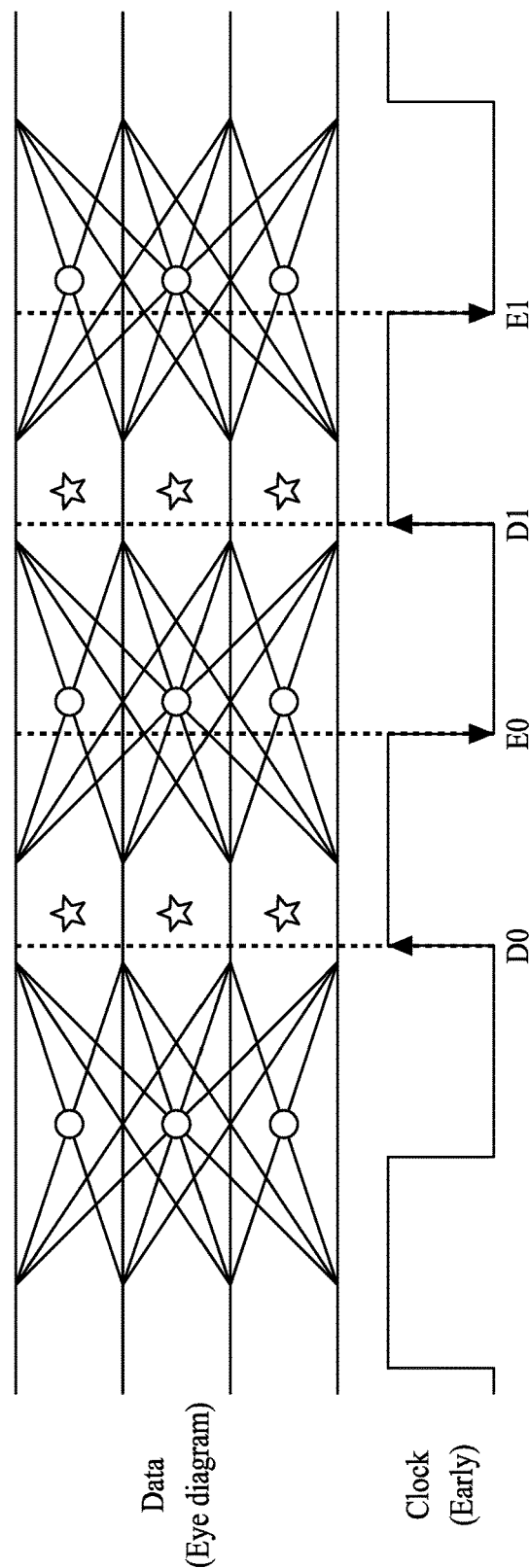
Figure 1C:
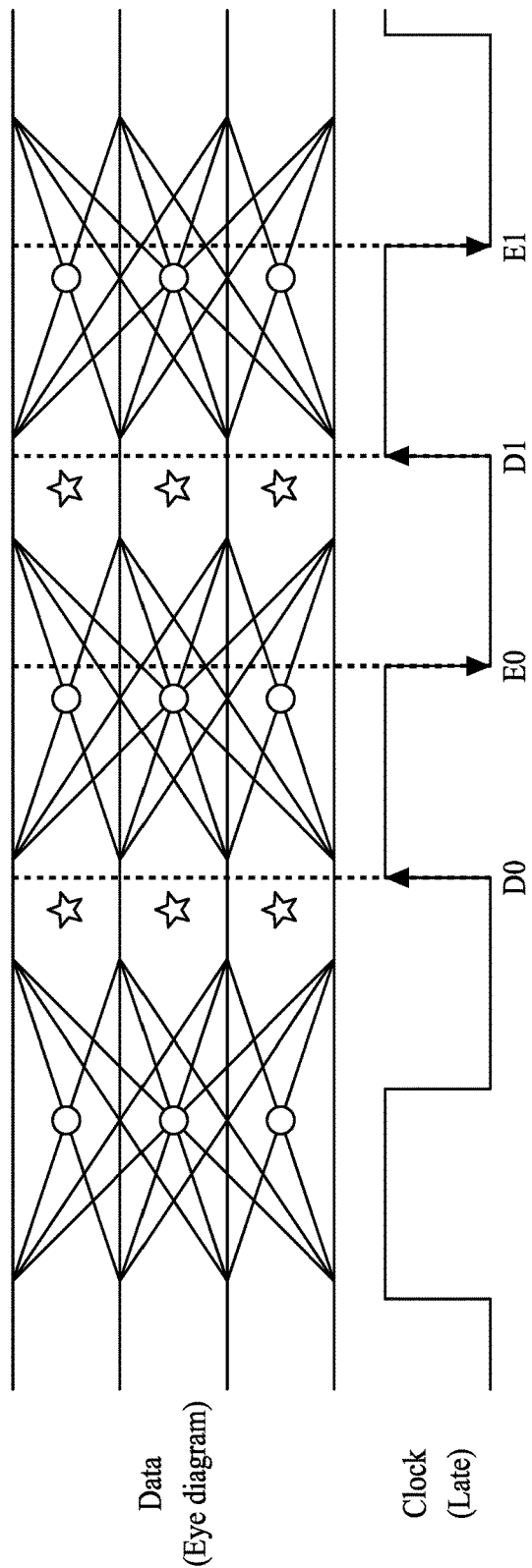

FIGS. 1A, 1B and 1C are schematic diagrams showing phase relationships between data and clock. Referring to FIG. 1A, data, in the form of eye diagram, include data centers indicated by a star sign and data edges indicated by a circle. A data center refers to an optimal point to sample data, and a data edge refers to a point at which the data correctness rate is 50% as the data is sampled. In a locked state, as in the present case shown in FIG. 1A, a sampling clock samples the data centers at a rising edge such as D0 and samples the data edges at a falling edge such as E0. Moreover, D0 and E0 sample data, for example, D[N], and D1 and E1 sample data D[N+1].

Referring to FIG. 1B, the rising edges D0 and D1 and the falling edges E0 and E1 of the clock are ahead of their corresponding data centers and their corresponding data edges, respectively, which is called an early clock state. As a result, D0 and E0 sample data D[N], while E0 and D1 sample different data D[N] and D[N+1], respectively. Based on the sampling result, the phase relationship between the data and the clock can be determined.

Referring to FIG. 1C, the rising edges D0 and D1 and the falling edges E0 and E1 of the clock are behind their corresponding data centers and their corresponding data edges, respectively, which is called a late clock state. As a result, D0 and E0 sample different data D[N] and D[N+1], respectively, while E0 and D1 sample data D[N+1]. Likewise, based on the sampling result, the phase relationship between the data and the clock can be determined.

FIG. 2 is a diagram showing a method of clock and data recovery (CDR), in accordance with some embodiments. For convenience, in the present disclosure, a four-level pulse amplitude modulation (PAM-4) system is used as an example. However, persons having ordinary skill in the art will understand that the method according to the present disclosure is not limited to the exemplary PAM-4 system and is applicable to other multi-level PAM systems or similar modulation mechanisms.

Referring to FIG. 2, data in PAM-4 transits from binary 00 (binary "xy" hereinafter referred to as "xy") to 01, 00 to 10, 00 to 11, 01 to 00, 01 to 10, 01 to 11, 10 to 00, 10 to 01, 10 to 11, 11 to 00, 11 to 01, and 11 to 10. Each transition is shown in a transition line. For example, an exemplary transition line 21L1 represents the transition from 11 to 10, and another exemplary transition line 21L2 represents the transition from 00 to 11. Accordingly, there are twelve transition lines in a PAM-4 system. In the method according to the present disclosure, thresholds VH, VM and VL are predetermined to facilitate CDR operation. The first threshold, VH, represents a level between 10 and 11. The second threshold, VM, represents a level between 01 and 10. The third threshold, VL, represents a level between 00 and 01. For a PAM-m system, m being a natural number greater than 2, the number of thresholds that is required to distinguish among the m binary levels is m-1. As in the present case, three thresholds are used to distinguish among the four binary levels in PAM-4. The levels of the thresholds VH, VM and VL are determined by the transition lines, as will be further discussed with reference to FIGS, 3A, 3B and 3C, respectively.

Moreover, in the method according to the present disclosure, clocks CKD, CKL and CKR are generated to sample data centers, left data edges and right data edges, respectively, of data at rising edges. For example, clock CKD samples data centers 28 of data at D1, clock CKL samples left data edges 26L of the data at L1, and clock CKR samples right data edges 26R of the data at R1.

Figure 3A:
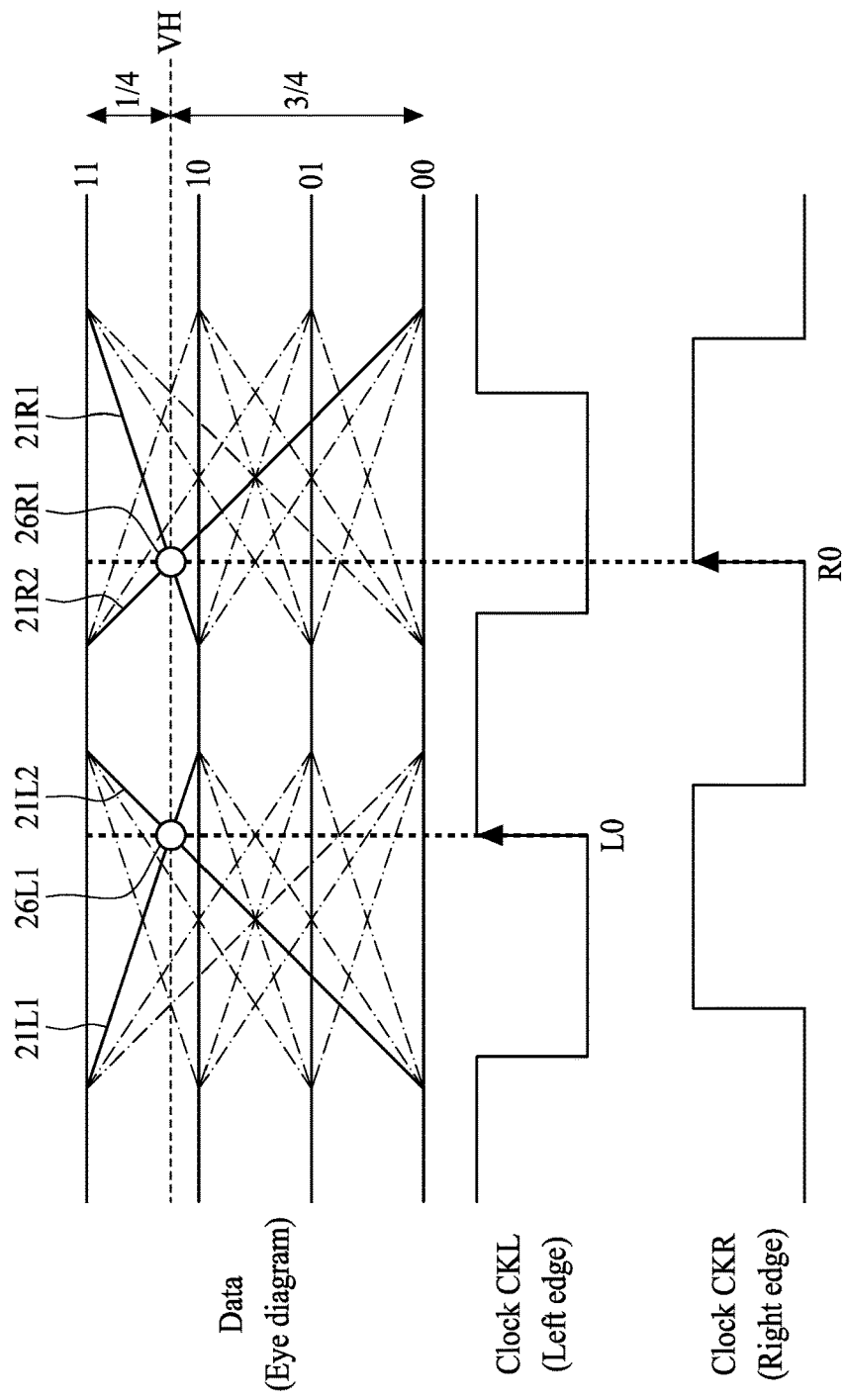
FIGS. 3A, 3B and 3C are diagrams showing thresholds for CDR operation, in accordance with some embodiments.
Figure 3B:
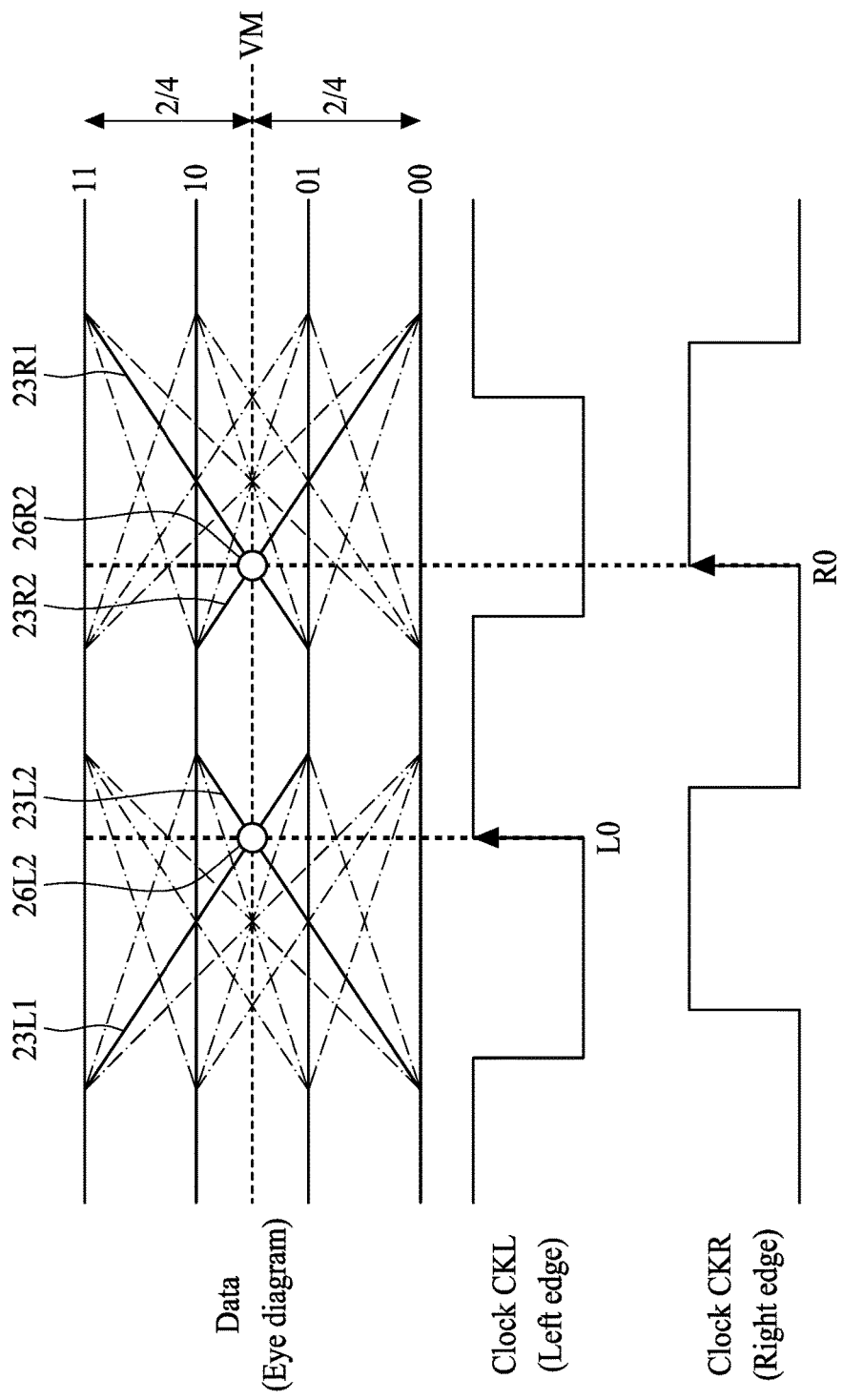
Figure 3C:
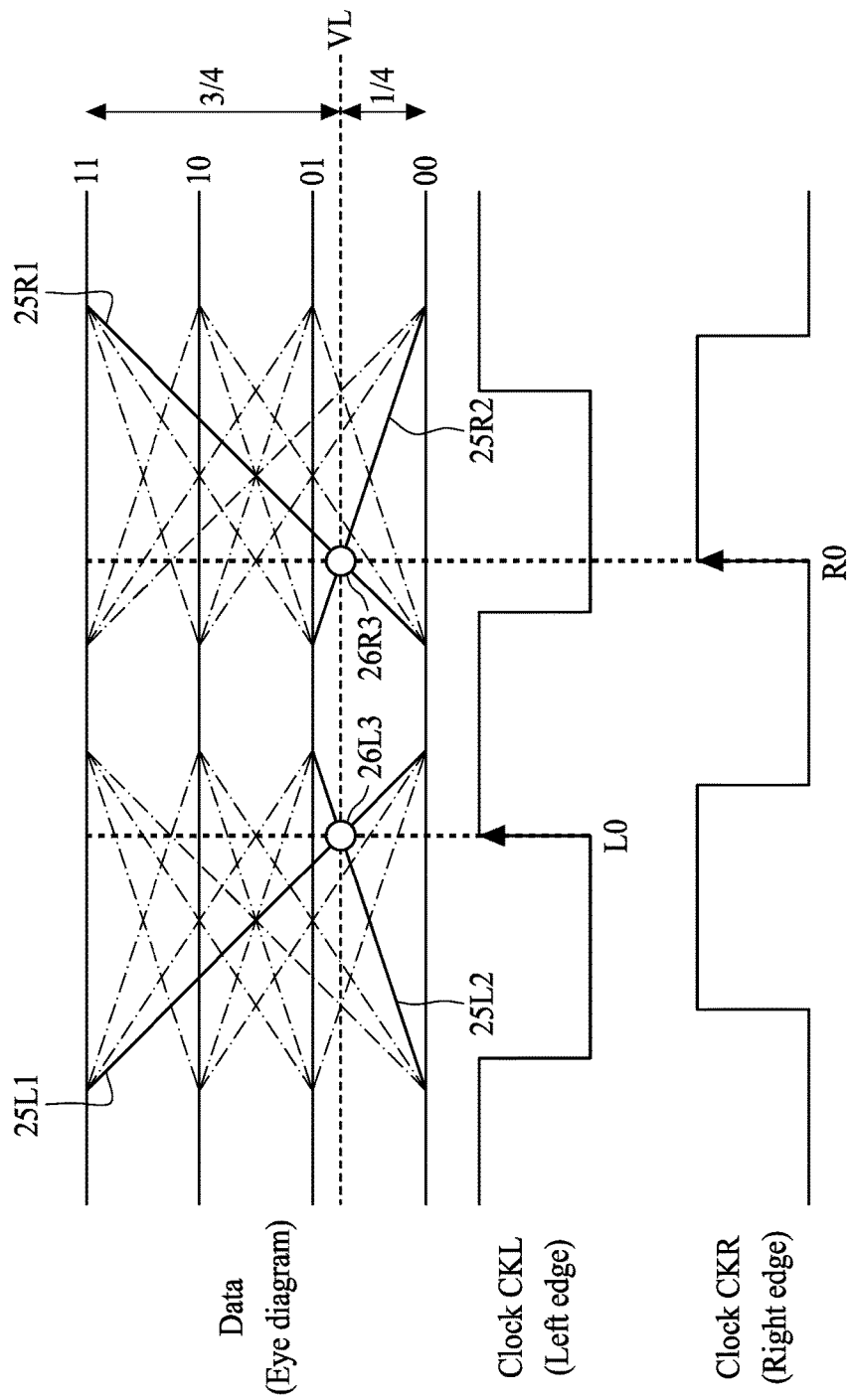

FIGS. 3A, 3B and 3C are diagrams of the thresholds VH, VM and VL, respectively, in accordance with some embodiments. Referring to FIG. 3A, the threshold VH is defined by a line passing through the intersection point 26L1 of transition lines 21L1 and 21L2 and the intersection point 26R1 of transition lines 21R1 and 21R2. As illustrated, the threshold VH is three quarters (¾) of the amplitude or eye height between 00 and 11. The transition lines 21L1 and 21L2 represent data transition from 11 to 10 and from 00 to 11, respectively. In addition, the transition lines 21R1 and 21R2 represent data transition from 10 to 11 and from 11 to 00, respectively. The intersection points 26L1 and 26R1 are a left data edge and a right data edge, respectively, relative to a data center therebetween. Moreover, in a locked state, the left data edge 26L1 is sampled at a rising edge such as L0 of the clock CKL, and the right data edge 26R1 is sampled at a rising edge such as R0 of the clock CKR.

Referring to FIG. 3B, the threshold VM is defined by a line passing through the intersection point 26L2 of transition lines 23L1 and 23L2 and the intersection point 26R2 of transition lines 23R1 and 23R2. The threshold VM is two quarters (²⁄₄) of the eye height. The transition lines 23L1 and 23L2 represent data transition from 11 to 01 and from 00 to 10, respectively. In addition, the transition lines 23R1 and 23R2 represent data transition from 01 to 11 and from 10 to 00, respectively. The intersection points 26L2 and 26R2 are a left data edge and a right data edge, respectively, relative to a data center therebetween. Moreover, in a locked state, the left data edge 26L2 is sampled at a rising edge such as L0 of the clock CKL, and the right data edge 26R2 is sampled at a rising edge such as R0 of the clock CKR.

Referring to FIG. 3C, the threshold VL is defined by a line passing through the intersection point 26L3 of transition lines 25L1 and 25L2 and the intersection point 26R3 of transition lines 25R1 and 25R2. The threshold VL is a quarter (¼) of the eye height. The transition lines 25L1 and 25L2 represent data transition from 11 to 00 and from 00 to 01, respectively. In addition, the transition lines 25R1 and 25R2 represent data transition from 00 to 11 and from 01 to 00, respectively. The intersection points 26L3 and 26R3 are a left data edge and a right data edge, respectively, relative to a data center therebetween. Moreover, in a locked state, the left data edge 26L3 is sampled at a rising edge such as L0 of the clock CKL, and the right data edge 26R3 is sampled at a rising edge such as R0 of the clock CKR.

Figure 4A:
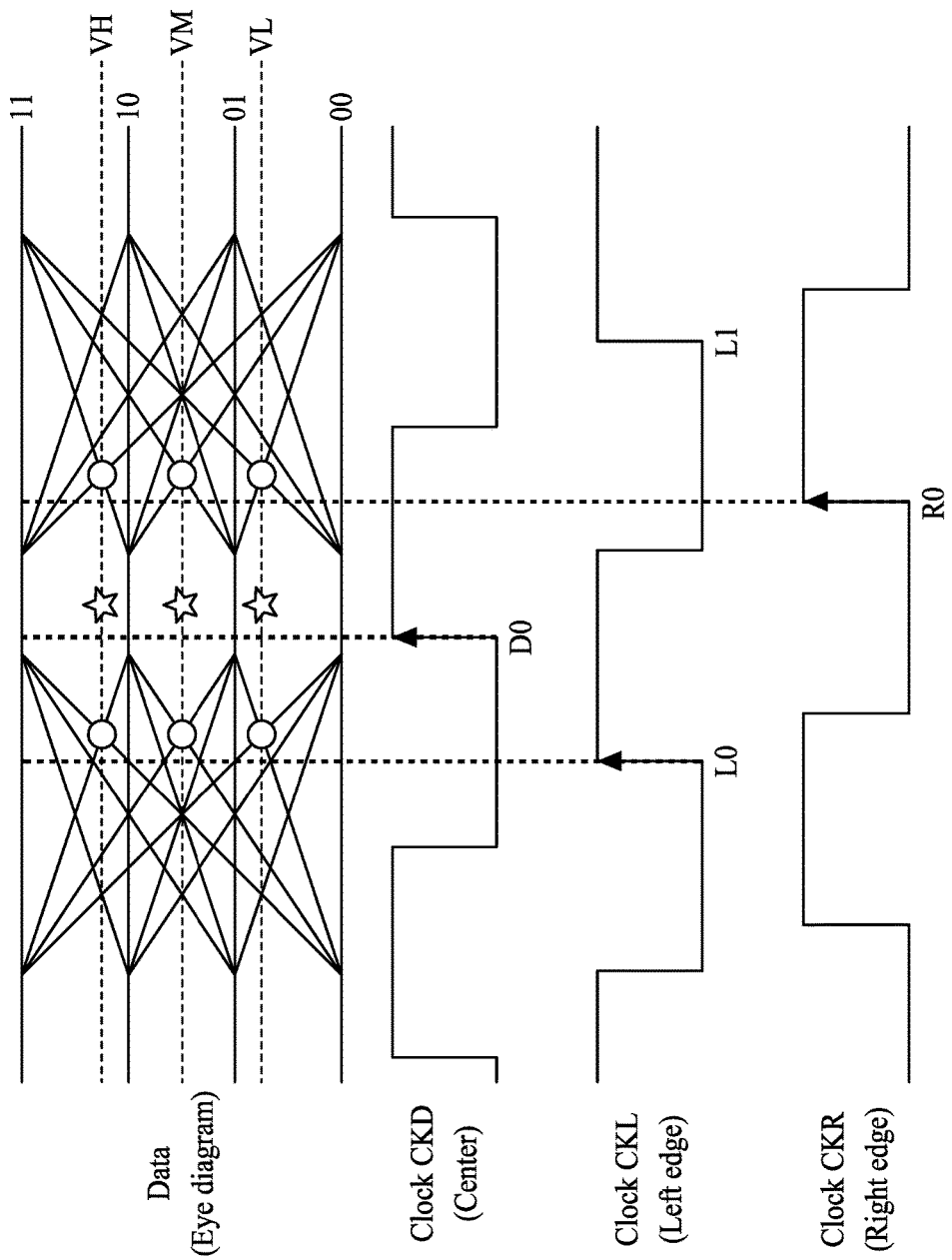
FIGS. 4A and 4B are diagrams showing a method of determining clock condition, in accordance with some embodiments.
Figure 4B:
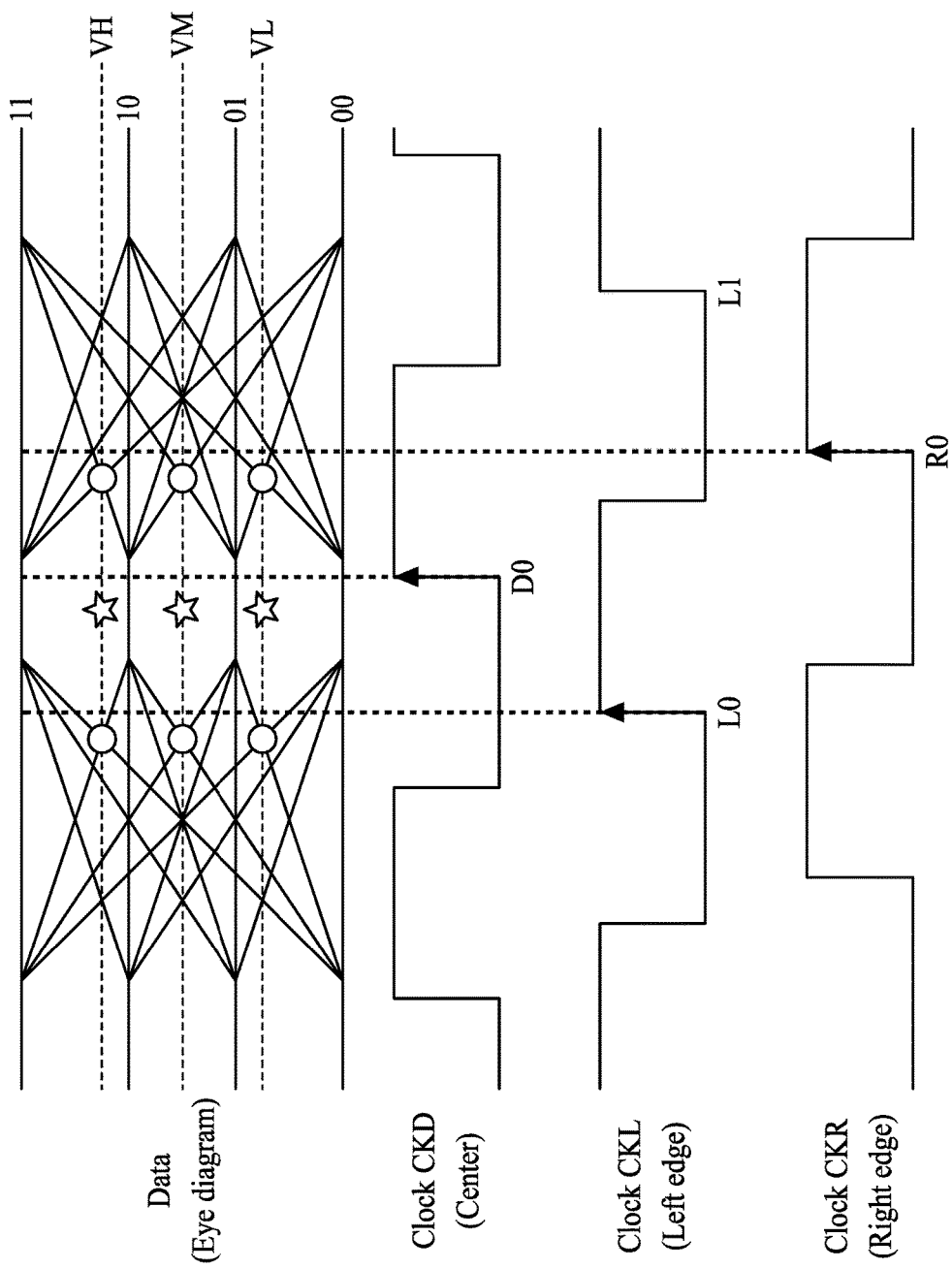

FIGS. 4A and 4B are diagrams showing a method of determining clock condition, in accordance with some embodiments. Specifically, the method determines whether a clock is sent early or late using the information on data edge as described and illustrated with reference to FIGS. 3A to 3C.

Referring to FIG. 4A, data corresponding to clock CKD is sampled at a left data edge in response to a rising edge L0 of clock CKL and sampled at a right edge in response to a rising edge of clock CKR. If the data center sampled in response to a rising edge D0 of clock CKD is greater than the threshold VH, the data has a binary value 11. In addition, if the data center sampled in response to a rising edge D0 of clock CKD is between the thresholds VH and VM, the data has a binary value 10. Also, if the data center sampled in response to a rising edge D0 of clock CKD is between the thresholds VM and VL, the data has a binary value 01. Moreover, if the data center sampled in response to a rising edge D0 of clock CKD is smaller than the threshold VL, the data has a binary value 00.

Further, when the data is 11 or 10, as indicated by the vertical dashed lines, if the left data edge is smaller than VH or the right data edge is greater than VH, both of which would otherwise equal VH in a locked state, it is determined that the sampling clock is sent early. Likewise, when the data is 10 or 01, if the left data edge is smaller than VM or the right data edge is greater than VM, both of which would otherwise equal VM in a locked state, it is determined that the sampling clock is sent early. Similarly, when the data is 01 or 00, if the left data edge is smaller than VL or the right data edge is greater than VL, both of which would otherwise equal VL in a locked state, it is determined that the sampling clock is sent early. Data transition and information on data edges to determine data transmission type are discussed in detail in Tables 1, 2 and 3.

Referring to FIG. 4B, as indicated by the vertical dashed lines, when the data is 11 or 10, if the left data edge is greater than VH or the right data edge is smaller than VH, both of which would otherwise equal VH in a locked state, it is determined that the sampling clock is sent late. Likewise, when the data is 10 or 01, if the left data edge is greater than VM or the right data edge is smaller than VM, both of which would otherwise equal VM in a locked state, it is determined that the sampling clock is sent late. Similarly, when the data is 01 or 00, if the left data edge is greater than VL or the right data edge is smaller than VL, both of which would otherwise equal VL in a locked state, it is determined that the sampling clock is sent late. Data transition and information on data edges to determine data transmission type are discussed in detail in Tables 1, 2 and 3.

Figure 5:
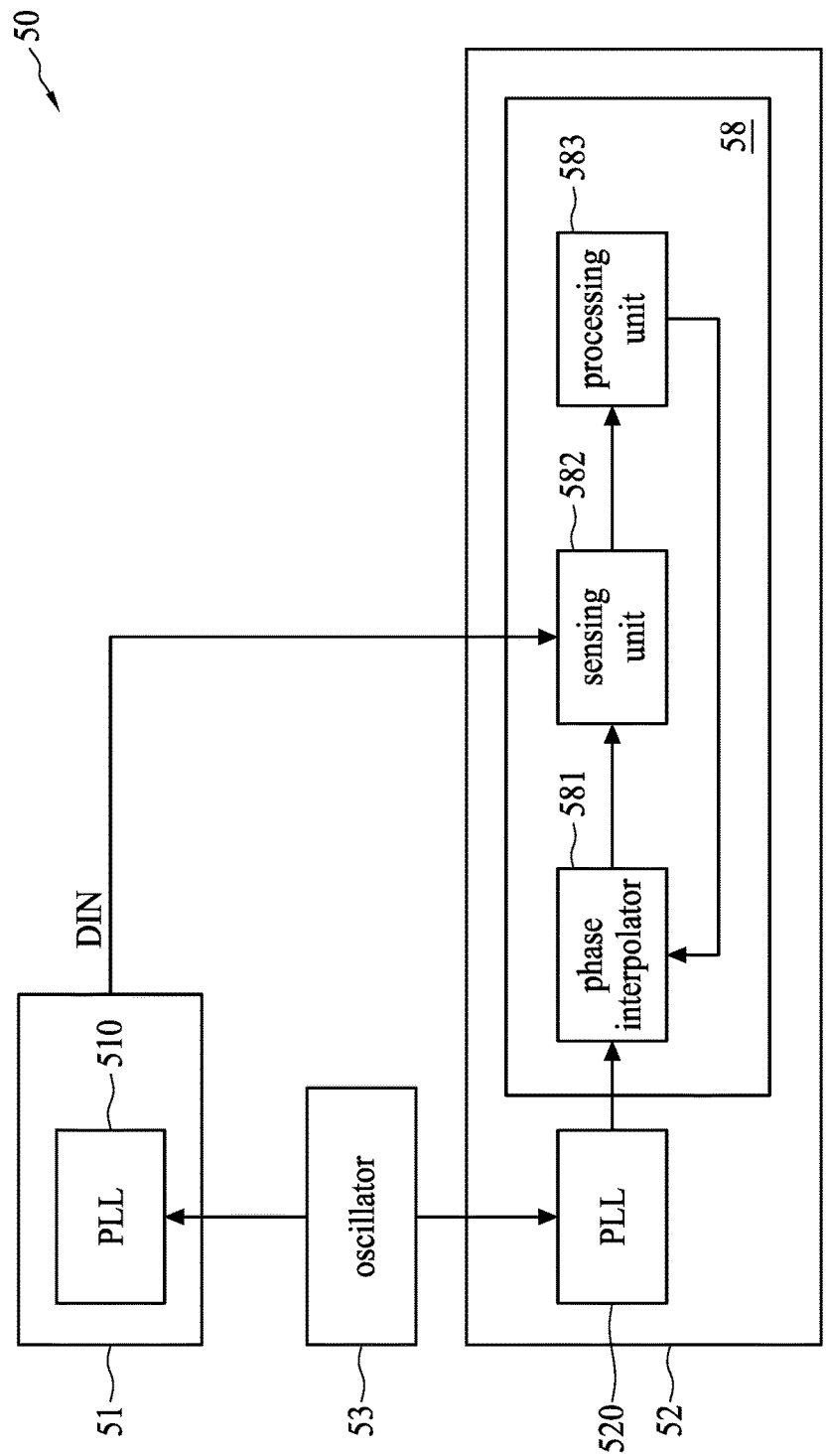
FIG. 5 is a block diagram of a communication system, in accordance with some embodiments.

FIG. 5 is a block diagram of a communication system 50, in accordance with some embodiments. Referring to FIG. 5, the communication system 50 includes a transmitter 51, a receiver 52 and an oscillator 53. The transmitter 51 includes a first phase-locked loop (PLL) 510, and transmits data DIN to the receiver 52. The receiver 52 includes a second PLL 520 and a clock and data recovery (CDR) 58. In addition, the oscillator 53 generates a clock signal at a frequency to first PLL 510 and the second PLL520. PLLs have been widely used in telecommunication and electronic applications. They can be used to generate an output signal whose phase is related to that of an input signal. In the present embodiment, the first PLL 510 and the second PLL 520 are configured to generate a stable frequency in response to an input frequency from the oscillator 53.

The CDR 58, configured to recover the data DIN from the transmitter 51, includes a phase interpolator 581, a sensing unit 582 and a processing unit 583. The sensing unit 582, in response to the data DIN from the transmitter 51, detects a data center and data edges associated with the data center of a data item on the incoming data stream DIN. In addition, the sensing unit 582 determines whether the data item is sent early or late based on information on the data edges, and provides the information to the processing unit 583. The processing unit 583 determines phase differences based on the information on the data edges. In an embodiment, the processing unit 583, which may include a logic circuit, determines phase differences by calculating an average when a predetermined amount of information on data edges is obtained. The processing unit 583 then provides a feedback signal to the interpolator 581. The interpolator 581 generates dock signals CKD, CKL and CKR based on the feedback signal to adjust phase differences.

Figure 6:
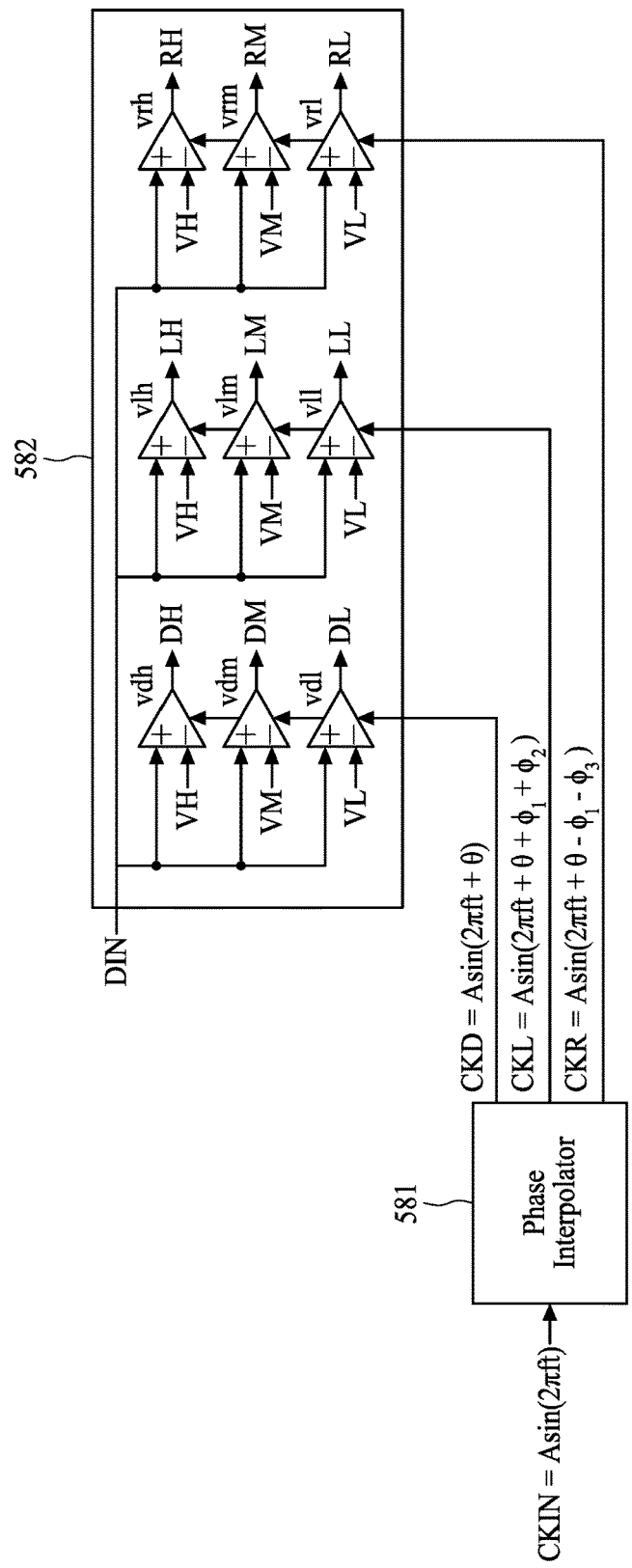
FIG. 6 is a diagram of an interpolator and a sensing unit of a CDR in the communication system illustrated in FIG. 5, in accordance with some embodiments.

FIG. 6 is a diagram of the interpolator 581 and the sensing unit 582 of the CDR 58 in the communication system 50 illustrated in 5, in accordance with some embodiments. Referring to FIG. 6, the interpolator 581 generates clock signals CKD, CKL and CKR to sample data centers, left data edges and right data edges, respectively, which will be discussed in detail with reference to FIGS. 7A, 7B and 7C. The sensing unit 582 includes nine (9) sense amplifiers for a PAM-4 CDR. The number of sense amplifiers may vary as the level of a multiple-level PAM system varies. Specifically, the sensing unit 582 includes sense amplifiers labeled vdh, vdm and vdl to determine whether a data center of a data is greater than the thresholds VH, VM and VL in response to the clock CKD and provide outputs DH, DM and DL. Also, the sensing unit 582 includes sense amplifiers labeled vlh, vlm and vll to determine whether a left edge of the data is greater than the thresholds VH, VM and VL in response to the clock CKL and provide outputs LH, LM and LL. Moreover, the sensing unit 582 includes sense amplifiers labeled vrh, vrm and vrl to determine whether a right edge of the data is greater than the thresholds VH, VM and VL in response to the clock CKR and provide outputs RH, RM and RL.

Table 1, Table 2 and Table 3 below are truth tables showing outputs of sense amplifiers and twelve transitions.

TABLE 1

| DH[N] | 1 | 1 | DH[N] | 0 | 0 | DH[N] | 0 | 0 | DH[N] | 1 | 1 |
|---|---|---|---|---|---|---|---|---|---|---|---|
| DM[N] | — | — | DM[N] | 1 | 1 | DM[N] | 1 | 1 | DM[N] | — | — |
| DL[N] | — | — | DL[N] | — | — | DL[N] | — | — | DL[N] | — | — |
| DL[N − 1] | 0 | 0 | DH[N − 1] | 1 | 1 | DH[N + 1] | 1 | 1 | DH[N + 1] | 0 | 0 |
| LH[N] | 0 | 1 | LH[N] | 0 | 1 | RH[N] | 0 | 1 | RH[N] | 0 | 1 |
| transition | 00 to 11 | | transition | 11 to 10 | | transition | 10 to 11 | | transition | 11 to 00 | |
| clock | early | late | clock | late | early | clock | early | late | clock | late | early |

In Table 1, Table 2 and Table 3, the minus sign "−" represents a "don't care" condition. Further, DH[N], DM[N] and DL[N] represent the values output at sense amplifiers vdh, vdm and vdl when a data center of an N-th data in a data stream is sampled under clock CKD using the thresholds VH, VM and VL, respectively. In addition, LH[N], LM[N] and LL[N] represent the values output at sense amplifiers vlh, vlm and vll when a left data edge of the N-th data is sampled under clock CKL using the thresholds VH, VM and VL, respectively. Moreover, RH[N], RM[N] and RL[N] represent the values output at sense amplifiers vrh, vrm and vrl when a right data edge of the N-th data is sampled under clock CKR using the thresholds VH, VM and VL, respectively. The sensed values in Table 1 are discussed below.

(1-1) DH[N]=1 and DL[N−1]=0 (columns 1 to 3 in Table 1):

Since DH[N] is 1, the data center of the N-th data under sampling has a binary value greater than VH, which is identified as 11. Moreover, since the data center of the (N−1)-th data, DL-[N−1], is 0 and smaller than VL, the binary value of the (N−1)-th data immediately before the N-th data is identified 00. As a result, it can be determined that the data transits from 00 to 11. Further, if the left data edge LH[N] of the N-th data is 0, which means that the sensed left data edge bears more to the (N−1)-th data side than to the N-th data side, it is determined that the sampling clock is sent early. In contrast, if the left data edge LH[N] of the N-th data is 1, which means that the sensed left data edge bears more to the N-th data side than to the (N−1)-th data side, it is determined that the sampling clock is sent late.

(1-2) DH[N]=0, DM[N]=1 and DH[N−1]=1 (columns 4 to 6 in Table 1):

Since DH[N] is 0 and DM[N] is 1, the data center of the N-th data under sampling has a binary value between VH and VM, which is identified as 10. Moreover, since the data center of the (N−1)-th data, DH[N−1], is 1 and greater than VH, the binary value of the (N−1)-th data immediately before the N-th data is identified 11. As a result, it can be determined that the data transits from 11 to 10. Further, if the left data edge LH[N] of the N-th data is 0, which means that the sensed left data edge bears more to the N-th data side than to the (N−1)-th data side, it is determined that the sampling clock is sent late. In contrast, if the left data edge LH[N] of the N-th data is 1, which means that the sensed left data edge bears more to the (N−1)-th data side than to the N-th data side, it is determined that the sampling clock is sent early.

(1-3) DH[N]=0, DM[N]=1 and DH[N+1]=1 (columns 7 to 9 in Table 1):

Since DH[N] is 0 and DM[N] is 1, the data center of the N-th data under sampling has a binary value between VH and VM, which is identified as 10. Moreover, since the data center of the (N+1)-th data, DH[N+1], is 1 and greater than VH, the binary value of the (N+1)-th data immediately after the N-th data is identified 11. As a result, it can be determined that the data transits from 10 to 11. Further, if the right data edge RH[N] of the N-th data is 0, which means that the sensed right data edge bears more to the N-th data side than to the (N+1)-th data side, it is determined that the sampling clock is sent early. In contrast, if the right data edge RH[N] of the N-th data is 1, which means that the sensed right data edge bears more to the (N+1)-th data side than to the N-th data side, it is determined that the sampling clock is sent late.

(1-4) DH[N]=1 and DL[N+1]=0 (columns 10 to 12 in Table 1):

Since DH[N] is 1, the data center of the N-th data under sampling has a binary value greater than VH, which is identified as 11. Moreover, since the data center of the (N+1)-th data, DL[N+1], is 0 and smaller than VL, the binary value of the (N+1)-th data immediately after the N-th data is identified 00. As a result, it can be determined that the data transits from 11 to 00. Further, if the right data edge RH[N] of the N-th data is 0, which means that the sensed right data edge bears more to the (N+1)-th data side than to the N-th data side, it is determined that the sampling clock is sent late. In contrast, if the right data edge RH[N] of the N-th data is 1, which means that the sensed right data edge bears more to the N-th data side than to the (N+1)-th data side, it is determined that the sampling clock is sent early.

mined that the data transits from 01 to 11. Further, if the right data edge RM[N] of the N-th data is 0, which means that the sensed right data edge bears more to the N-th data side than to the (N+1)-th data side, it is determined that the sampling

TABLE 2

| DH[N] | 0 | 0 | DH[N] | — | — | DH[N] | — | — | DH[N] | 0 | 0 |
|---|---|---|---|---|---|---|---|---|---|---|---|
| DM[N] | 1 | 1 | DM[N] | 0 | 0 | DM[N] | 0 | 0 | DM[N] | 1 | 1 |
| DL[N] | — | — | DL[N] | 1 | 1 | DL[N] | 1 | 1 | DL[N] | — | — |
| DL[N − 1] | 0 | 0 | DH[N − 1] | 1 | 1 | DH[N + 1] | 1 | 1 | DL[N + 1] | 0 | 0 |
| LM[N] | 0 | 1 | LM[N] | 0 | 1 | RM[N] | 0 | 1 | RM[N] | 0 | 1 |
| transition | 00 to 10 | | transition | 11 to 01 | | transition | 01 to 11 | | transition | 11 to 00 | |
| clock | early | late | clock | late | early | clock | early | late | clock | late | early |

The sensed values in Table 2 are discussed below.

(2-1) DH[N]=0, DM[N]=1 and DH[N−1]=0 (columns 1 to 3 in Table 2):

Since DH[N] is 0 and DM[N] is 1, the data center of the N-th data under sampling has a binary value between VH and VM, which is identified as 10. Moreover, since the data center of the (N−1)-th data, DL[N−1], is 0 and smaller than VL, the binary value of the (N−1)-th data immediately before the N-th data is identified 00. As a result, it can be determined that the data transits from 00 to 10. Further, if the left data edge LM[N] of the N-th data is 0, which means that the sensed left data edge bears more to the (N−1)-th data side than to the N-th data side, it is determined that the sampling clock is sent early. In contrast, if the left data edge LM[N] of the N-th data is 1, which means that the sensed left data edge bears more to the N-th data side than to the (N−1)-th data side, it is determined that the sampling clock is sent late.

(2-2) DM[N]=0, DL[N]=1 and DH[N−1]=1 (columns 4 to 6 in Table 2):

Since DM[N] is 0 and DL[N] is 1, the data center of the N-th data under sampling has a binary value between VM and VL, which is identified as 01. Moreover, since the data center of the (N−1)-th data, DH[N−1], is 1 and greater than VH, the binary value of the (N−1)-th data immediately before the N-th data is identified 11. As a result, it can be determined that the data transits from 11 to 01. Further, if the left data edge LM[N] of the N-th data is 0, which means that the sensed left data edge bears more to the N-th data side than to the (N−1)-th data side, it is determined that the sampling clock is sent late. In contrast, if the left data edge LM[N] of the N-th data is 1, which means that the sensed left data edge bears more to the (N−1)-th data side than to the N-th data side, it is determined that the sampling clock is sent early.

(2-3) DM[N]=0, DL[N]=1 and DH[N+1]=1 (columns 7 to 9 in Table 2):

Since DM[N] is 0 and DL[N] is 1, the data center of the N-th data under sampling has a binary value between VM and VL, which is identified as 01. Moreover, since the data center of the (N+1)-th data, DH[N+1], is 1 and greater than VH, the binary value of the (N+1)-th data immediately after the N-th data is identified 11. As a result, it can be deterclock is sent early. In contrast, if the right data edge RM[N] of the N-th data is 1, which means that the sensed right data edge bears more to the (N+1)-th data side than to the N-th data side, it is determined that the sampling clock is sent late.

(2-4) DH[N]=0, DM[N]=1 and DL[N+1]=0 (columns 10 to 12 in Table 2):

Since DH[N] is 0 and DM[N] is 1, the data center of the N-th data under sampling has a binary value between VH and VM, which is identified as 10. Moreover, since the data center of the (N+1)-th data, DL[N+1], is 0 and smaller than VL, the binary value of the (N+1)-th data immediately after the N-th data is identified 00. As a result, it can be determined that the data transits from 10 to 00. Further, if the right data edge RM[N] of the N-th data is 0, which means that the sensed right data edge bears more to the (N+1)-th data side than to the N-th data side, it is determined that the sampling clock is sent late. In contrast, if the right data edge RM[N] of the N-th data is 1, which means that the sensed right data edge bears more to the N-th data side than to the (N+1)-th data side, it is determined that the sampling clock is sent early.

TABLE 3

| DH[N] | — | — | DH[N] | — | — | DH[N] | — | — | DH[N] | — | — |
|---|---|---|---|---|---|---|---|---|---|---|---|
| DM[N] | 0 | 0 | DM[N] | — | — | DM[N] | — | — | DM[N] | 0 | 0 |
| DL[N] | 1 | 1 | DL[N] | 0 | 0 | DL[N] | 0 | 0 | DL[N] | 1 | 1 |
| DL[N − 1] | 0 | 0 | DH[N − 1] | 1 | 1 | DH[N + 1] | 1 | 1 | DL[N + 1] | 0 | 0 |
| LL[N] | 0 | 1 | LL[N] | 0 | 1 | RL[N] | 0 | 1 | RL[N] | 0 | 1 |
| transition | 00 to 01 | | transition | 11 to 10 | | transition | 00 to 11 | | transition | 01 to 00 | |
| clock | early | late | clock | late | early | clock | early | late | clock | late | early |

The sensed values Table 3 are discussed below.

(3-1) DM[N]=0, DL[N]=1 and DL[N−1]=0 (columns 1 to 3 in Table 3):

Since DM[N] is 0 and DL[N] is 1, the data center of the N-th data under sampling has a binary value between VM and VL, which is identified as 01. Moreover, since the data center of the (N−1)-th data, DL[N−1], is 0 and smaller than VL, the binary value of the (N−1)-th data immediately before the N-th data is identified 00. As a result, it can be determined that the data transits from 00 to 01. Further, if the left data edge LL[N] of the N-th data is 0, which means that the sensed left data edge bears more to the (N−1)-th data side than to the N-th data side, it is determined that the sampling clock is sent early. In contrast, if the left data edge LL[N] of the N-th data is 1, the sensed left data edge bears more to the N-th data side than to the (N−1)-th data side, it is determined that the sampling clock is sent late.

(3-2) DL[N]=0 and DH[N−1]=1 (columns 4 to 6 in Table 3):

Since DL[N] is 0, the data center of the N-th data under sampling has a binary value smaller than VL, which is identified as 00. Moreover, since the data center of the (N−1)-th data, DH[N−1], is 1 and greater than VH, the binary value of the (N−1)-th data immediately before the N-th data is identified 11. As a result, it can be determined that the data transits from 11 to 00. Further, if the left data edge LL[N] of the N-th data is 0, which means that the sensed left data edge bears more to the N-th data side than to the (N−1)-th data side, it is determined that the sampling clock is sent late. In contrast, if the left data edge LL[N] of the N-th data is 1, which means that the sensed left data edge bears more to the (N−1)-th data side than to the N-th data side, it is determined that the sampling clock is sent early.

(3-3) DL[N]=0 and DH[N+1]=1 (columns 7 to 9 in Table 3):

Since DL[N] is 0, the data center of the N-th data under sampling has a binary value smaller than VL, which is identified as 00. Moreover, since the data center of the (N+1)-th data, DH[N+1], is 1 and greater than VH, the binary value of the (N+1)-th data immediately after the N-th data is identified 11. As a result, it can be determined that the data transits from 00 to 11. Further, if the right data edge RL[N] of the N-th data is 0, which means that the sensed right data edge bears more to the N-th data side than to the (N+1)-th data side, it is determined that the sampling clock is sent early. In contrast, if the right data edge RL[N] of the Nth data is 1, which means that the sensed right data edge bears more to the (N+1)-th data side than to the N-th data side, it is determined that the sampling clock is sent late.

(3-4) DM[N]=0, DL[N]=1 and DL[N+1]=0 (columns 10 to 12 in Table 3):

Since DM[N] is 0 and DL[N] is 1, the data center of the N-th data under sampling has a binary value between VM and VL, which is identified as 01. Moreover, since the data center of the (N+1)-th data, 1)14N+1 I, is 0 and smaller than VL, the binary value of the (N+1)-th data immediately after the N-th data is identified 00. As a result, it can be determined that the data transits from 01 to 00. Further, if the right data edge RL[N] of the N-th data is 0, which means that the sensed right data edge bears more to the (N+1)-th data side than to the N-th data side, it is determined that the sampling clock is sent late. In contrast, if the right data edge RL[N] of the N-th data is 1, which means that the sensed right data edge bears more to the N-th data side than to the (N+1)-th data side, it is determined that the sampling clock is sent early.

Referring back to FIG. 6, the CDR 58 includes a phase-tracking loop to align the clock signal CKD with a data center, and an eye opening monitor loop to align the clock signal CKL with a left edge of the data and to align the clock signal CKR with a right edge of the data. The phase-tracking loop includes a first set of sense amplifiers vdh, vdm and vdl, which use thresholds VH, VM and VL to determine a binary level of the data center in response to the clock signal CKD. The monitor loop includes a second set of sense amplifiers vlh, vlm and vll for sampling a left edge of the data using the thresholds VH, VM and VL in response to the clock signal CKL, and a third set of sense amplifiers vrh, vrm and vrl for sampling a right edge of the data using the thresholds VH, VM and VL in response to the clock signal CKR. Based on the information on data center from the first set of amplifiers, and the information on data edges from the second and third set of sense amplifiers, data transition type and clock transmission timing are determined.

Figure 7A:
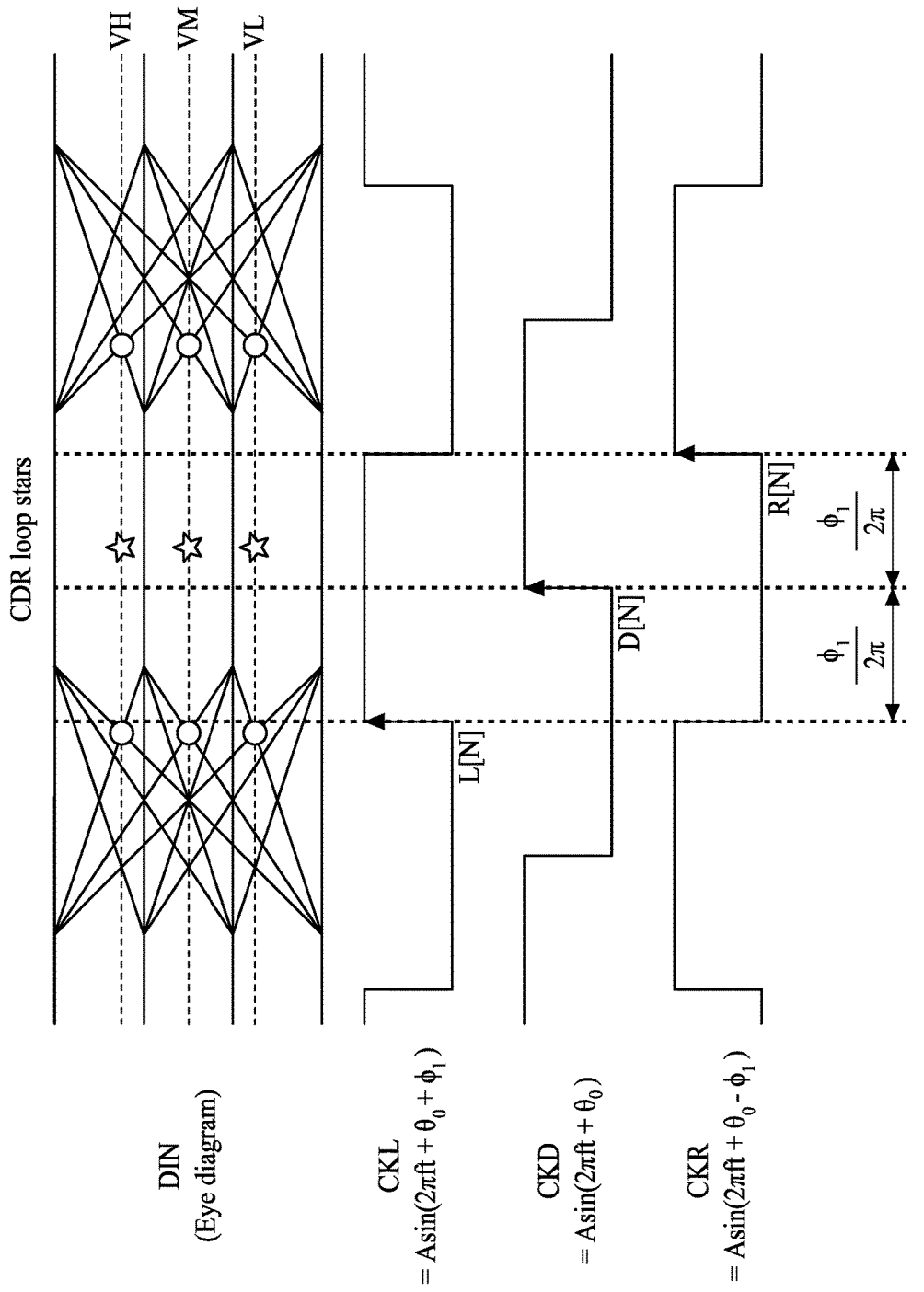
FIGS. 7A, 7B and 7C are diagrams showing an exemplary method of clock and data recovery, in accordance with some embodiments.
Figure 7B:
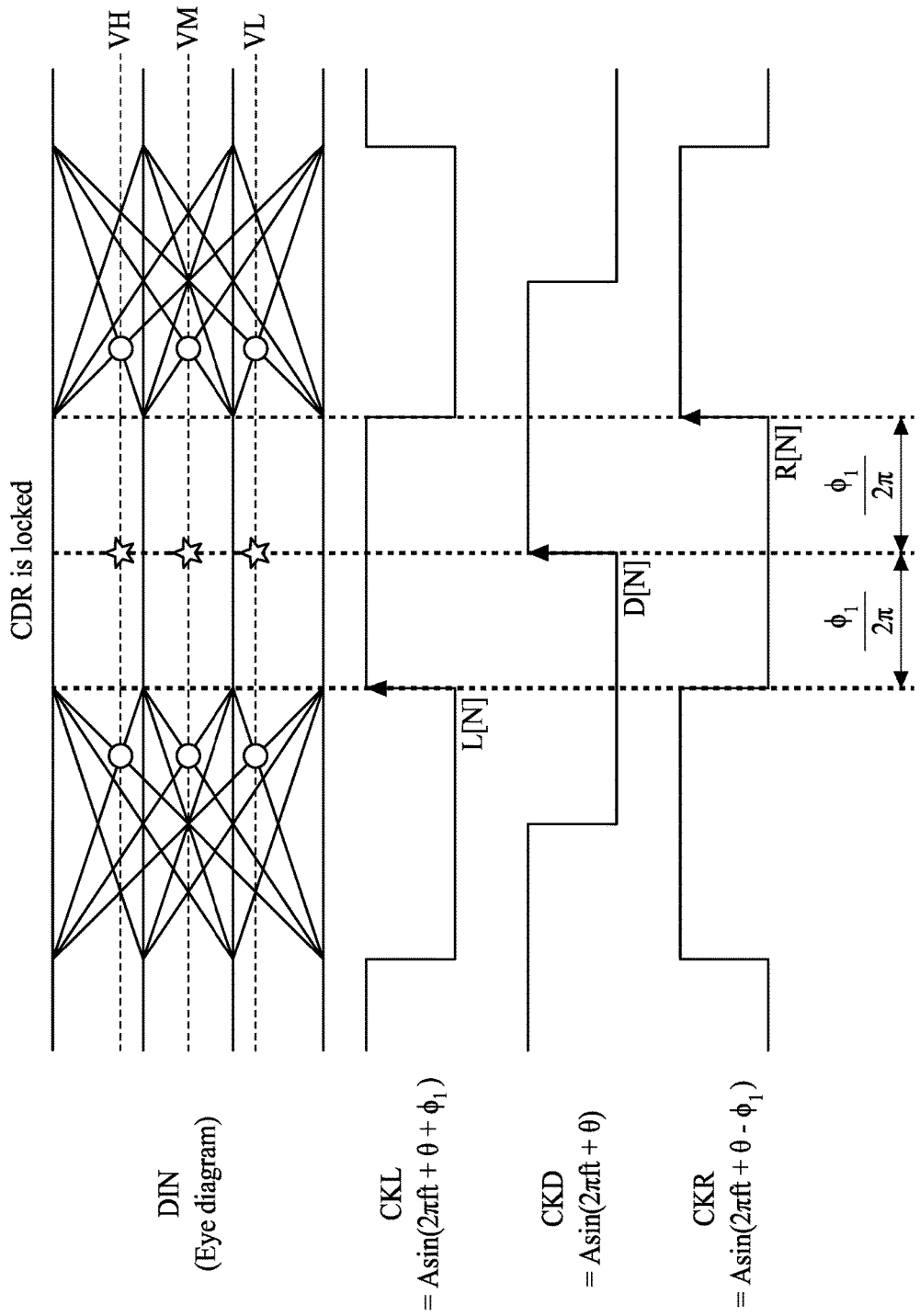
Figure 7C:
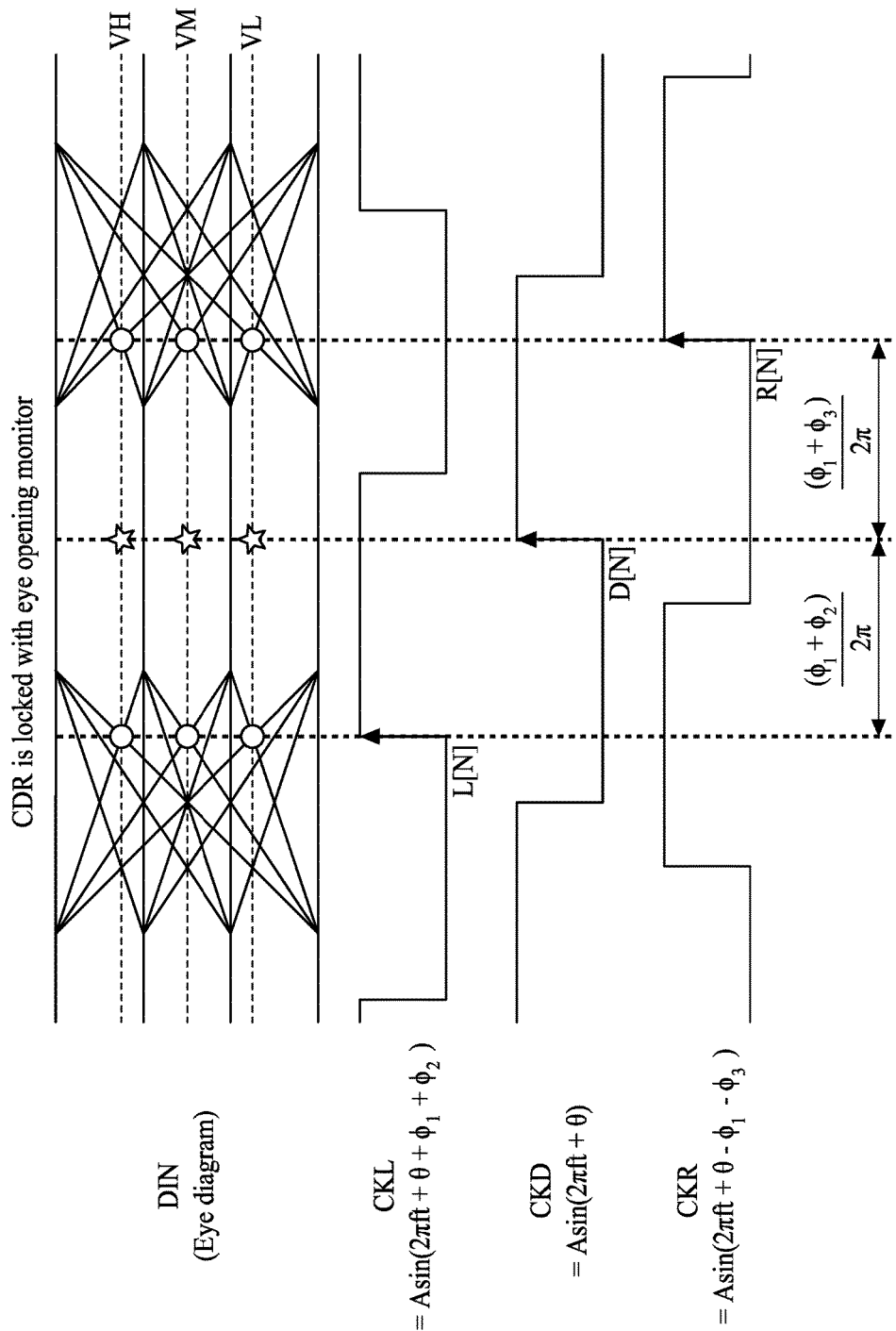

FIGS. 7A, 7B and 7C are diagrams showing an exemplary method of clock and data recovery, in accordance with some embodiments. Referring to FIG. 7A, initially a clock signal CKD=Asin($2\pi ft+\theta_0$) is used to sample a data center of a data item, where A represents the amplitude, f represents frequency and a phase angle $\theta_0$ represents an initial phase relationship between the clock signal CKD and the data. To align the CKD with the data, the CDR 58 starts to operate by adding a first predetermined phase difference $\phi_1$ to the clock signals CKL and CKR. Since the clock signal CKL is late, first predetermined phase difference $\phi_1$ with a plus sign is added, which causes $\theta_0$ in the clock signal CKL to increase. Moreover, since the clock signal CKR is early, first predetermined phase difference $\phi_1$ with a minus sign is added, which causes $\theta_0$ in the clock signal CKR to decrease. Even though the first predetermined phase difference $\phi_1$ may riot be a correct phase difference to sample data edges, an average result from the processing unit 583 is able to align the CKD with the data so that the CDR 58 reaches a locked state.

Referring to FIG. 7B, the clock signal CKD in the locked state becomes CKD=Asin($2\pi ft\theta$) by the function of CDR 58, where a phase angle $\theta$ represents a phase relationship between the clock signal CKD and the data when CDR 58 is locked. In addition, the clock signals CKL and CKR become CKL=Asin($2\pi ft+\theta+\phi_1$) and CKR=Asin($2\pi ft+\theta-\phi_1$), respectively. While the clock signal CKD is aligned, by the function of sensing unit 582, as shown in FIG. 7B clock signal CKL is still determined to be late and clock signal CKR is still determined to be early.

As a result, referring to FIG. 7C, a second phase difference $\phi_2$ with a plus sign and a third phase difference $\phi_3$ with a minus sign are added to the clock signals CKL and CKR, respectively, resulting in CKL=Asin($2\pi ft+\theta+\phi_1+\phi_2$) and CKR=Asin($2\pi ft+\theta-\phi_1-\phi_3$). The adjustment by adding the second phase difference $\phi_2$ and the third phase difference $\phi_3$ aligns the resultant clock signals CKL and CKR with their corresponding data edges. The eye opening is [($\phi_1+\phi_2$)/$2\pi$]+[($\phi_1+\phi_3$)/$2\pi$], or ($2\phi_1+\phi_2+\phi_3$)/$2\pi$. Since addition or subtraction of the second and third phase differences $\phi_2$ and $\phi_3$ depends on whether the clock signals CKL and CKR are lagging or leading, a phase angle of the clock signal CKL is a function of $\phi_1$ and $\phi_2$, and a phase angle of the clock signal CKR is a function of $\phi_1$ and $\phi_3$. Moreover, a general form of the eye opening can be written as ($2\phi_1+\phi_2+\phi_3$)/$2\pi$.

Figure 8:
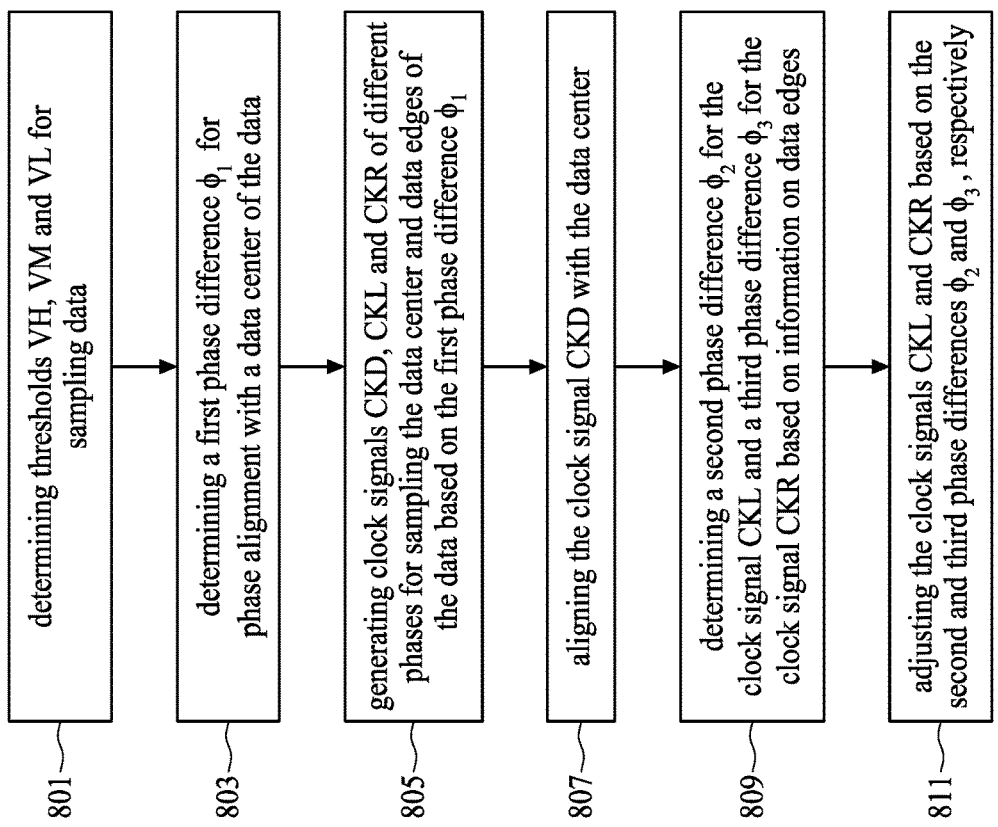
FIG. 8 is a flow diagram showing a method of clock and data recovery, in accordance with some embodiments.

FIG. 8 is a flow diagram showing a method of clock and data recovery, in accordance with some embodiments. Referring to FIG. 8, in operation 801, for a PAM-4 system, thresholds VH, VM and VL are determined. Each of the thresholds VH, VM and VL relates to a different level among four binary levels of a data in the PAM-4 system.

In operation 803, a first phase difference $\phi_1$ for phase alignment with a data center of the data is determined.

In operation 805, clock signals CKD, CKL and CKR of different phases for sampling the data center, a left data edge and a right data edge of the data, respectively are generated based on the first phase difference $\phi_1$. Information on data edges is thereby obtained.

In operation 807, the clock signal CKD is aligned with the data center, using first phase difference $\phi_1$, to lock a CDR device.

In operation 809, a second phase difference $\phi_2$ for the clock signal CKL and a third phase difference $\phi_3$ for the clock signal CKR are determined based on the information on data edges.

In operation 811, the clock signals CKL and CKR are adjusted based on the second and third phase differences $\phi_2$ and $\phi_3$, respectively. The data sampled with the clock signals CKL and CKR have a probability of 50% the same as that sampled after transition. Moreover, an eye opening can be determined based on the phase differences $\phi_1$, $\phi_2$ and $\phi_3$.

Figure 9:
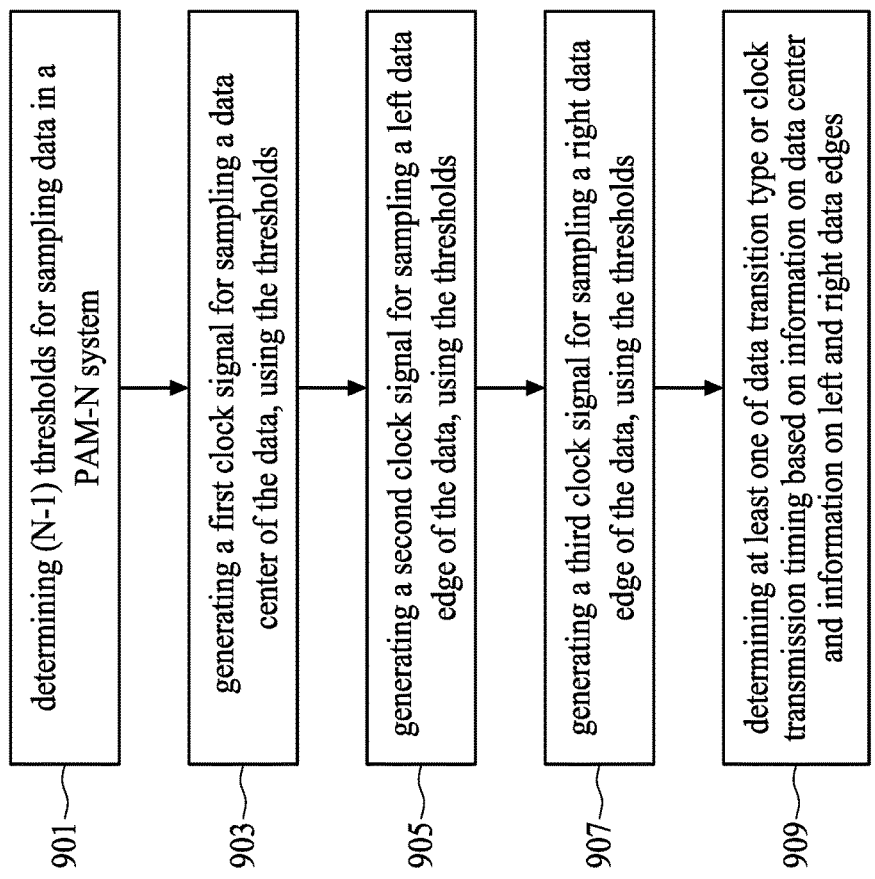
FIG. 9 is a flow diagram showing a method of clock and data recovery, in accordance with some embodiments.

FIG. 9 is a flow diagram showing a method of clock and data recovery, in accordance with some embodiments. While the method shown in FIG. 8 is applicable to a PAM-4 system, the method shown in FIG. 9 is applicable to a PAM-N or other similar systems, N being a natural number greater than 3.

In operation 901, (N−1) thresholds for sampling data in a PAM-N system are determined. Each of the thresholds relates to a different level among N data levels of a data in the PAM-N system.

In operation 903, a first clock signal is generated for sampling a data center of the data, using the thresholds. Information on the data center is thereby obtained.

In operation 905, a second clock signal is generated for sampling a left data edge of the data, using the thresholds.

In operation 907, a third clock signal is generated for sampling a right data edge of the data, using the thresholds. By performing operation 905 and 907, information on data edges is obtained.

In operation 909, data transition type and clock transmission timing, referring to Table 1, 2 or 3, are determined based on the information on data center and the information on left and right data edges.

In some embodiments, the present disclosure provides a clock and data recovery (CDR) device. The CDR device comprises a sensing unit and an interpolator. The sensing unit is configured to detect a data center, a left data edge and a right data edge of a data on a data stream in a communication system, using a set of thresholds, in response to a first clock signal for sampling the data center, a second clock signal for sampling the left data edge and a third clock signal for sampling the right data edge. Each of the thresholds is related to a different level among data levels of the data. The interpolator is configured to generate the first clock signal based on information on the data center, and generate the second clock signal and the third dock signal based on information on the left and right data edges.

In some embodiments, the present disclosure also provides a method of clock and data recovery. The method comprises an operation to determine a number of thresholds for sampling data on a data stream in a communication system, each of the thresholds being related to a different level among data levels of the data, an operation to determine a first phase difference for phase alignment with a data center of the data, an operation to generate clock signals of different phases based on the first phase difference for sampling, using the thresholds, the data center and data edges of the data, thereby obtaining information on data edges, an operation to align the clock signal for sampling the data center with the data center, an operation to determine a second phase difference for phase alignment with a left data edge of the data, and a third phase difference for phase alignment with a right data edge of the data based on the information on data edges, and an operation to adjust the dock signals for sampling the data edges based on the second and third phase differences.

In some embodiments, the present disclosure provides a method of clock and data recovery in an N-level pulse width modulation (PAM-4) system. The method comprises an operation to determine (N−1) thresholds for sampling a data on a data stream, each of the thresholds being related to a different level among data levels of the data, an operation to generate a first clock signal for sampling, using the thresholds, a data center of the data, thereby obtaining information on data center, an operation to generate a second clock signal for sampling, using the thresholds, a left data edge of the data, and generating a third clock signal for sampling, using the thresholds, a right data edge of the data, thereby obtaining information on left and right data edges, and an operation to determine transmission timing of the first, second and third clock signal based on the information on data center and the information on left and right data edges.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock and data recovery (CDR) device, comprising:
a sensing unit configured to detect a data center, a left data edge and a right data edge of a data on a data stream in a communication system, using a set of thresholds, in response to a first clock signal for sampling the data center, a second clock signal for sampling the left data edge and a third clock signal for sampling the right data edge, each of the thresholds being related to a different level among data levels of the data;
an interpolator configured to generate the first clock signal based on information on the data center, and to generate the second clock signal and the third clock signal based on information on the left and right data edges; and
a processing unit configured to determine a first phase difference $\phi 1$ for the first clock signal, and determine, based on the information on the left and right data edges, a second phase difference $\phi 2$ for the second clock signal and a third phase difference $\phi 3$ for the third clock signal,
wherein a phase angle of the second clock signal is a function of the first phase difference $\phi 1$ and the second phase difference $\phi 2$, and a phase angle of the third clock signal is a function of the first phase difference $\phi 1$ and the third phase difference $\phi 3$.

2. The CDR device according to claim 1, wherein the sensing unit includes a first set of sense amplifiers to detect the data center of the data in response to the first clock signal.

3. The CDR device according to claim 1, wherein the sensing unit includes a second set of sense amplifiers to detect the left data edge of the data in response to the second clock signal.

4. The CDR device according to claim 1, wherein the sensing unit includes a third set of sense amplifiers to detect the right data edge of the data in response to the third clock signal.

5. The CDR device according to claim 1, wherein the communication system includes a four-level pulse amplitude modulation (PAM-4) system, and wherein the first threshold has a value between binary 11 and 10, the second threshold has a value between binary 10 and 01, and the third threshold has a value between binary 01 and 00.

6. The CDR device according to claim 1, wherein an eye opening of the data is $(2\ \phi 1+\phi 2+\phi 3)/2\pi$.

7. A method of clock and data recovery in an N-level pulse amplitude modulation (PAM-N) system, the method comprising:

determining (N−1) thresholds for sampling a data on a data stream, each of the thresholds being related to a different level among data levels of the data;

generating a first clock signal for sampling, using the thresholds, a data center of the data, thereby obtaining information on data center;

generating a second clock signal for sampling, using the thresholds, a left data edge of the data, and generating a third clock signal for sampling, using the thresholds, a right data edge of the data, thereby obtaining information on left and right data edges; and determining transmission timing of the first, second and third clock signal based on the information on data center and the information on the left and the right data edges, wherein the determining the transmission timing of the first, second and third clock signals includes:

determining a first phase difference $\phi 1$ for the first clock signal, determining a second phase difference $\phi 2$ for the second clock signal based on the information on the left data edge, and determining a third phase difference $\phi 3$ for the third clock signal based on the information on the right data edge, wherein a phase angle of the second clock signal is a function of the first phase difference $\phi 1$ and the second phase difference $\phi 2$, and a phase angle of the third clock signal is a function of the first phase difference $\phi 1$ and the third phase difference $\phi 3$.

8. The method according to claim 7 further comprising determining a data transition type based on the information on data center and the information on left and right data edges.

9. The method according to claim 7, wherein N equals 4, and wherein the thresholds include a first threshold having a value between binary 11 and 10, a second threshold having a value between binary 10 and 01, and a third threshold having a value between binary 01 and 00.

10. A method of clock and data recovery, the method comprising:

generating a first clock signal, based on information on a data center of a data on a data stream in a communication system, for sampling the data center of the data;

generating a second clock signal, based on the first clock signal and information on a left data edge of the data, for sampling the left data edge of the data;

generating a third clock signal, based on the first clock signal and information on a right data edge of the data, for sampling the right data edge of the data;

using a set of thresholds to detect the data center, the left data edge and the right data edge to obtain the information on the data center, the information on the left data edge and the information on the right data edge, respectively;

determining a first phase difference $\phi 1$ for the first clock signal;

determining a second phase difference $\phi 2$ for the second clock signal based on the information on the left data edge; and determining a third phase difference $\phi 3$ for the third clock signal based on the information on the right data edge, wherein a phase angle of the second clock signal is a function of the first phase difference $\phi 1$ and the second phase difference $\phi 2$, and a phase angle of the third clock signal is a function of the first phase difference $\phi 1$ and the third phase difference $\phi 3$.

11. The method according to claim 10, wherein the communication system comprises a four-level pulse amplitude modulation (PAM-4) system, and the set of thresholds comprises a first threshold having a value between binary 11 and 10, a second threshold having a value between binary 10 and 01, and a third threshold having a value between binary 01 and 00.

12. The method according to claim 10, wherein an eye opening of the data is $(2\phi 1 + \phi 2 + \phi + 3)/2\pi$.

13. The method according to claim 10, further comprising:

determining transmission timing of the first, second and third clock signals based on the information on the data center, the information on the left data edge and the information on the right data edge.

14. The method according to claim 10, further comprising:

determining a data transition type based on the information on the data center, the information on the left data edge and the information on the right data edge.

* * * * *